United States Patent [19]
Patz

[11] Patent Number: 4,716,367
[45] Date of Patent: Dec. 29, 1987

[54] CREATION AND USE OF A MOVING REFERENCE FRAME FOR NMR IMAGING OF FLOW

[75] Inventor: H. Samuel Patz, Wayland, Mass.

[73] Assignee: Brigham & Women's Hospital, Boston, Mass.

[21] Appl. No.: 896,814

[22] Filed: Aug. 15, 1986

[51] Int. Cl.$^4$ .......................................... G01R 33/20
[52] U.S. Cl. .................................. 324/309; 324/306
[58] Field of Search ............... 324/300, 306, 307, 309, 324/318, 322; 128/653

[56] References Cited

U.S. PATENT DOCUMENTS

| | | |
|---|---|---|
| 3,191,119 | 6/1965 | Singer . |
| 3,419,793 | 12/1968 | Genthe et al. . |
| 3,419,795 | 12/1968 | Genthe et al. . |
| 3,473,108 | 10/1969 | McCormick . |
| 3,551,794 | 12/1970 | Vander Heyden et al. . |
| 3,562,632 | 2/1971 | Kirkland . |
| 4,015,196 | 3/1977 | Moore et al. . |
| 4,471,305 | 9/1984 | Crooks et al. . |
| 4,516,582 | 5/1985 | Redington . |
| 4,520,828 | 6/1985 | Burl et al. . |
| 4,528,509 | 7/1985 | Radda et al. . |
| 4,532,473 | 7/1985 | Wehrli ................................. 324/306 |
| 4,532,474 | 7/1985 | Edelstein . |
| 4,574,239 | 3/1986 | Singer .................................. 324/306 |
| 4,574,240 | 3/1986 | Libove et al. . |
| 4,595,879 | 6/1986 | Lent et al. . |
| 4,602,641 | 7/1986 | Feinberg . |
| 4,609,872 | 9/1986 | O'Donnell ........................... 324/306 |
| 4,613,818 | 9/1986 | Battocletti .......................... 324/306 |
| 4,621,234 | 11/1986 | Caprihan ............................ 324/306 |
| 4,629,987 | 12/1986 | King et al. .......................... 324/306 |
| 4,638,251 | 1/1987 | King .................................... 324/300 |
| 4,639,671 | 1/1987 | Macovski ........................... 324/306 |

FOREIGN PATENT DOCUMENTS 1508438  4/1978  United Kingdom .

OTHER PUBLICATIONS

Singer and Grover, "Recent Measurements of Flow Using Nuclear Magnetic Resonance Techniques", Modern Developments in Flow Measurement, Clayton Ed., pp. 38–47 (1971).

Garroway, "Velocity Measurements in Flowing Fluids by MNR", Journal of Physics D: Applied Physics, vol. 7, pp. L159–L163 (1974).

Singer, "NMR Diffusion and Flow Measurements and an Introduction to Spin Phase Graphing", J. Phys. I. Sci. Instrumen., vol. 11, pp. 281–291 (1978).

Halbach et al., "Blood Flow Imaging Techniques Using NMR", IEEE 1982 Frontiers of Engineering in Health Care, pp. 1–4 (Sep. 20–21, 1982).

Singer and Crooks, "Nuclear Magnetic Resonance Blood Flow Measurements in The Human Brain", Science, vol. 221, pp. 654–656 (1983).

(List continued on next page.)

Primary Examiner—Michael J. Tokar
Attorney, Agent, or Firm—Saidman, Sterne, Kessler & Goldstein

[57] ABSTRACT

The present invention provides an NMR image in which the individual image element intensities are proportional to the amount of nuclei flowing within a window of velocities. The invention is predicated on the fact that static nuclei in a static reference frame provide the most intense portions of the NMR signal. A moving reference frame for image creation is created moving at the velocity of the nuclei to be imaged. Nuclei moving at the same velocity as the reference frame thus have zero velocity with respect to the reference frame, and hence provide maximum signal intensity. In the described embodiment, the moving reference frame is created by satisfaction of two conditions, which relate to tracking the Larmor frequency and phase of the nuclei of interest moving in a gradient. These conditions may be satisfied by variation of the main NMR magnetic field $H_o$ as a function of time. The field may be varied simply by addition of an additional coil to conventional NMR equipment. The invention is applicable to image formation using either steady state free precession techniques or conventional spin echo techniques.

33 Claims, 12 Drawing Figures

OTHER PUBLICATIONS

Singer and Crooks, "Using NMR to Measure Blood Flow Volume and Velocity", VD&T, Jan./Feb. 1984.

Taylor and Bushell, "The Spatial Mapping of Translational Diffusion Coefficients by the NMR Imaging Technique", Phys. Med. Biol., vol. 30, No. 4, pp. 345–349 (1985).

Hinshaw, "Image Formation by Nuclear Magnetic Resonance: The Sensitive Point Method", J. Appl. Phys., 47, 8, pp. 3709–3721 (1976).

Carr, "Steady State Free Precession in Nuclear Magnetic Resonance", *Physical Review*, vol. 112, No. 5, pp. 1693–1701.

Mansfield and Morris "3.4 Steady State Free Precession", *NMR Imaging in Biomedicine*, Academic Press, 1982, pp. 65–77.

FIG. 4a
FIG. 4b
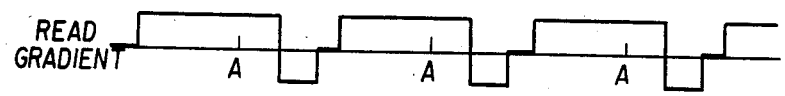
FIG. 4c
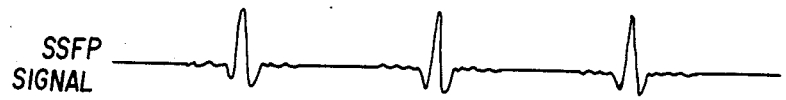
FIG. 5a
FIG. 5b
FIG. 5c
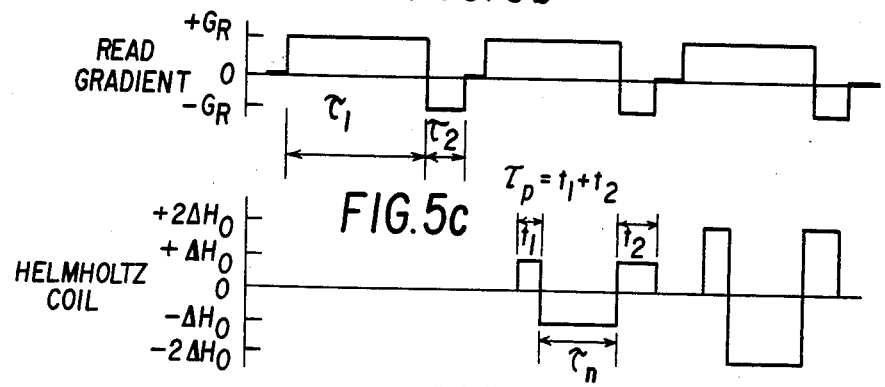
FIG. 5d

CREATION AND USE OF A MOVING REFERENCE FRAME FOR NMR IMAGING OF FLOW

CROSS-REFERENCE TO RELATED APPLICATION

This application is generally related to U.S. patent application Ser. No. 765,528, filed Aug. 14, 1985.

FIELD OF THE INVENTION

This invention relates to improvements in nuclear magnetic resonance imaging techniques. More particularly, this invention relates to methods for creating a moving reference frame for imaging nuclei using nuclear magnetic resonance techniques. The moving frame of reference is useful for a number of purposes, such as imaging flow. The technique of the invention is particularly useful for imaging flow at extremely low flow rates, such as blood flow in capillaries.

BACKGROUND OF THE INVENTION

The techniques of nuclear magnetic resonance are well known to the art. In general, nuclear magnetic resonance involves aligning the magnetic moments of atomic nuclei in a sample by exposing the sample to a relatively strong external magnetic field. A pulse of radio frequency energy is then applied to the sample, to cause the moments of the nuclei to be aligned along a particular axis, typically 90° to the axis of the external magnetic field. Over time, the nuclei will return to alignment with the external field. As they do so, they emit electromagnetic radiation which can be detected.

The rate at which the moments of the nuclei return to alignment with the external field is characteristic of the nuclei and the nuclear site. This fact is used in a variety of methods for generating images of the nuclei, for example, in a "slice" of human body or other sample in which they are located. In this way, a detailed cross-sectional view of the body is provided, in a non-invasive technique.

A number of different types of NMR-produced images are available, in which the intensity of each element of the image varies according to various parameters. Images in which the intensity of each element varies with blood flow rate have also been provided, as discussed below.

NMR imaging is inherently useful for imaging nuclear flow. See generally, Axel, *Am. J. Roentgenol.* 143, 1157 (1984), and Singer, "NMR Diffusion and Flow Measurements: An Introduction to Spin Phase Graphing" *J. Phys. B: Scientific Instruments*, Vol. 11, pp. 281–291 (1978). Moore et al. U.S. Pat. No. 4,015,196 suggests the application of a technique known as steady state free precession to the study of flow. The steady state free precession technique is defined generally at column 7, lines 15–57, of the Moore et al. patent and is related to flow among other uses at column 7, lines 58–61. However, for a variety of reasons, the steady state free precession (SSFP) technique had not in general been extremely popular in practical applications. Recently, however, SSFP has to some extent become repopularized. One technique which has remained popular from its inception is the "spin-echo" technique.

An example of the prior art "spin echo" flow measurement technique used is generally as follows. An initial magnetic field $H_0$ is supplied to cause all the nuclear spins to line up. Application of a RF pulse, using what is referred to as a 90° pulse, to indicate that the spins are rotated 90° with respect to the applied magnetic field $H_0$, then realigns the spins at 90° to $H_0$. A magnetic field having a gradient (that is, the magnetic field varies in the plane of the "slice" in which flow is to be measured) is applied. The gradient causes the polarized spins to dephase, that is, precess at varying rates, so as to go out of phase as a function of time. Due to their precession the nuclei emit a detectable "NMR" signal. The net dephasing is due to inhomogeneties in the field $H_0$ and due to local field fluctuations due to tissue type, density of nuclei, nuclear type, etc. After a specific time $\tau$, a second radio frequency pulse is applied, which again tips the spins in the slice. In this case, the RF pulse is usually 180°, that is, it causes the nuclei to rotate 180°. The 180° pulse causes the accumulated phase of the spins to be reversed. Thus, after an additional time $\tau$, each of the spins will return its initial phase, that is, they will "rephase" at 90° to $H_0$. In this way the effects of any static inhomogeneity of $H_0$ are cancelled, leaving the "informational" portions of the "spin-echo" signal. Nuclei which flow into the slice of the body during the spin-echo creation process or between successive spin-echoes have different effects on the signal. These facts are utilized in a wide variety of flow imaging techniques.

As is well known, the nuclei precess about the external field at a frequency referred to as the Larmor frequency, which is proportional to the magnetic field at their location. The signal emitted is a function of the precession frequency. Since a gradient has been imposed upon the external field, the Larmor frequencies of nuclei at different positions within the slice vary. Accordingly, a Fourier transform of the data, providing as it does a frequency distribution of the nuclei, simultaneously provides a spatial distribution of the nuclear density within the matrix. Hence, the Fourier-transformed data can be used to directly form an image. This imaging technique, of course, is well known to the prior art, and is referred to here only to provide a basis for the subsequent discussion.

In copending Ser. No. 765,528, filed Aug. 14, 1985 now abandoned, and incorporated herein by reference, the present inventor and another describe an improved NMR flow imaging technique in which two images are generated using steady state free precession techiques. Subtraction of one image from the other provides an image in which the intensity of each image element is proportional only to the density of nuclei flowing slowly therethrough. An image of capillary flow rates was thus provided. See also Patz et al., "The Application of Steady-State Free Precession to the Study of Very Slow Fluid Flow", *Magnetic Resonance in Medicine*, 3, 140–145 (1986), incorporated herein by reference.

The steady state free precession technique, as is understood in the prior art, involves application of repetitive pulses of radio frequency energy to a sample which is in a magnetic field gradient, such that the nuclear magnetization which is established in this "driven-equilibrium" state has a spatial periodicity along the direction of the magnetic field gradient. The spatial periodicity can be varied by changing the interpulse interval $\tau$ or the gradient strength. The magnetization of the nuclei is periodic and oscillates as a function of position along the direction of the gradient. The length over which one oscillation of magnetization occurs is the spatial periodicity.

According to the invention described in Ser. No. 765,528, two images are produced, each with different spacings $\tau_1$ and $\tau_2$ of the RF pulses in time, such that the spatial periodicity of the data used to generate the images differs. When the Fourier transform process is applied to transform the data from time-based samples to frequency-based samples, the spatial periodicity may be automatically compensated for, such that the images can be directly subtracted from one another. When this is done, fixed components (that is, due to non-moving nuclei in the tissues) disappear from the signal, leaving a portion of the signal which is proportional only to flow.

By careful selection of the spatial periodicity, by control of the interpulse interval or the gradient strength, nuclei flowing at relatively high flow rates, (such as blood in veins, arteries and the like), do not appear in the signal because they do not remain in the spaced locations long enough to arrive in the driven equilibrium state.

The result is that only slow flow rate nuclei, flowing in a window of velocities defined by the interpulse intervals $\tau_1$ and $\tau_2$, for example in capillaries and the like, contribute to the remainder signal. Subtraction of the images removes the static nuclei, as these contribute equally to both. The difference between the two images is proportional to the flow within certain velocity limits defined by the window. These limits may be set to encompass the range of capillary flow.

One difficulty with the subtraction technique just described is that the slowly flowing nuclei contribute only a few percent of the total signal, such that the subtraction must be very accurately performed if the relative difference between the images is not to be lost.

The flow imaging technique described in Ser. No. 765,528 also is limited to blood flow at relatively low velocities. Other flow imaging techniques are also limited to particular velocities. It would also be desirable to provide an image forming technique which generates maximum signal from nuclei moving at any flow rate of interest, including, for example, pulsatile flow in the heart or the like, such that accurate images thereof can be accurately developed.

Recently, a number of additional NMR flow-imaging techniques have also been described. For example, see Taylor and Bushell, *Phys. Med. Biol.* 30, no. 4, p. 345, 347 (1985); Wedeen, V. J. et al., *Science*, 230, 946 (1985). In this latter disclosure spin-echo images of the heart are made synchronized by an EKG signal to coincide with systole and diastole, and are subtracted to yield an image responsive to maximum excursion. Dixon, W. T. et al., *Mag. Res. in Medicine* 3, 454 (1986) shows imaging the carotid artery using subtraction techniques.

Each of these techniques involves generation of plural images and performance of a mathematical operation on the images to remove the static spins (that is, to remove the contribution of the stationary nuclei) from the signal. These techniques therefore all suffer from the drawbacks of requiring extra time to form plural images and of requiring relatively high signal-to-noise ratios, so that the resultant image is meaningful. While some of these techniques have been used to provide actual images of blood flow in patients, their clinical usefulness is still limited. Several of these techniques are practically limited to relatively rapid flow rates.

OBJECTS OF THE INVENTION

It is therefore an object of the invention to provide an improved flow imaging technique in which only a single image is generated, such that subtraction of images to generate a difference image can be avoided.

A further object of the invention is to provide a flow imaging technique which is more versatile than methods shown in the prior art, and which in particular is capable of generating an image flow at any desired velocity of interest, including non-steady velocities.

It is a further object of the invention to provide a simplified method for providing an image in which the intensity of individual image elements is proportional to the rate of flow of a fluid in a body member.

By comparison to the NMR techniques available to image flow, as described above, techniques for NMR imaging of static nuclei are highly developed. It would be desirable if the skill of the art in imaging static nuclei could be applied to imaging flowing nuclei.

An ultimate object of the invention is therefore to provide an NMR flow imaging technique in which the image formation techniques known to the art for use in imaging static nuclei may be employed.

SUMMARY OF THE INVENTION

The present invention provides an NMR image in which the individual image element intensities are proportional to the amount of nuclei flowing within a window of velocities. The invention is predicated on the fact that static nuclei in a static magnetic field provide the most intense portions of the NMR signal. According to the invention, a moving reference frame is in effect created. Nuclei moving at the same velocity as the reference frame thus have zero velocity with respect to the moving magnetic field, and hence provide maximum signal intensity. Nuclei moving relative to the moving reference frame contribute proportionally lesser to the signal as the relative velocity increases. Thus a "window" of nuclear velocities is created.

In this manner, one can choose the rate of motion of the frame of reference to be equivalent to the rate of motion of any particular group of nuclei sought to be imaged. For example if one desires to explore blood flow in capillaries at 1 millimeter per second, one can simply move the frame of reference at that rate. The nuclei moving at that velocity will then contribute most intensely to the NMR signal, and the image can be interposed on that basis. Similarly, the frame of reference may be varied in a non-linear or pulsatile manner if one wishes for example to image nuclei moving in a similar manner, such as blood nuclei in the vicinity of the heart. The invention is applicable to image formation using either steady state free precession (SSFP) techniques or conventional spin echo techniques.

BRIEF DESCRIPTION OF THE DRAWINGS

The invention will be better understood if reference is made to the accompanying drawings in which:

FIGS. 4(a), 4(b) and 4(b) show respectively the spacing of the radio frequency pulses in time, the read gradient applied, and the received SSFP signal, for the case of a one-dimensional experiment with zero velocity reference frame;

FIGS. 5(a), 5(b), 5(c) and 5(d) show respectively the spacing of the radio frequency pulses in time, the read gradient employed, the field of the Helmholtz coil, and the SSFP signal which is received, for the case of a one-dimensional experiment with a moving reference frame;

DESCRIPTION OF THE PREFERRED EMBODIMENTS

As discussed briefly above, the basic techniques of NMR imaging are well known to the art. Therefore, when a particular technique or method is not described in detail herein, it is to be understood that it is generally within the prior art; reference is made generally thereto and specifically to the publications incorporated by reference above, for more detailed discussion of such matters. The disclosure herein is meant to support the claims hereof, and not to provide an exhaustive review of NMR techniques generally.

Figure 1:
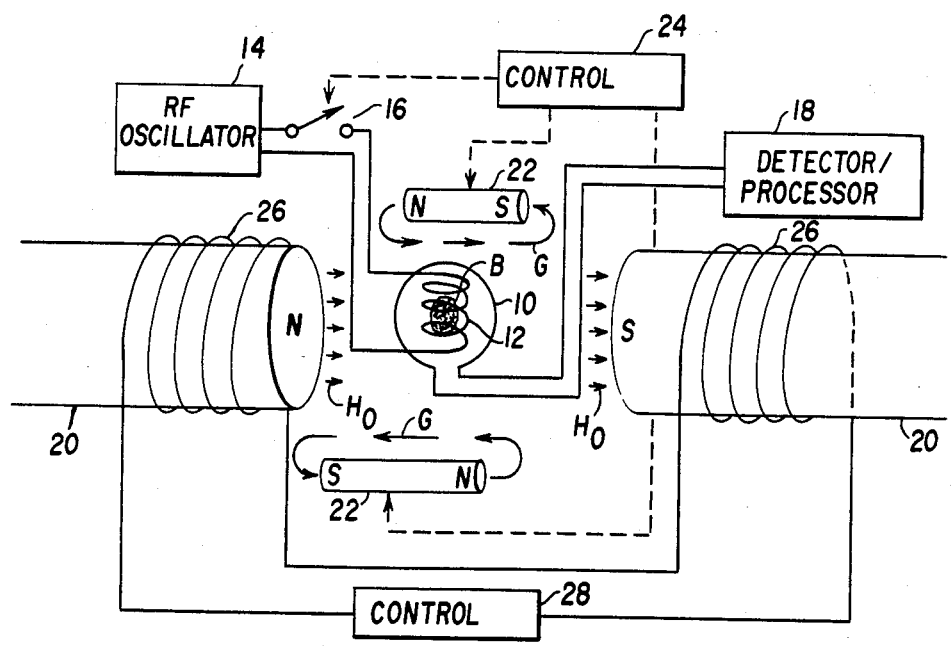
FIG. 1 shows schematically the experimental apparatus.

Referring now to FIG. 1, a schematic view of experimental apparatus for performing NMR imaging in accordance with the present invention is shown. A sample B is confined within a pair of coils 10 and 12. Coil 12 is connected to a radio frequency oscillator 14 by a switch 16 controlled by control device 24, so that when switch 16 is closed, a pulse of radio frequency energy is applied to the sample therewithin. Coil 10 is connected to detector and processing devices indicated generally at 18. The apparatus shown in FIG. 1 is generally according to the teachings of the prior art.

The sample B and the two coils 10 and 12 (which may be the same) are all confined within a large-valued, for example, 0.1–2.0 Tesla, magnetic field $H_0$ shown schematically as being provided by the two poles, marked N and S, of a large magnet 20. An additional gradient field is provided by additional magnets 22. These are controlled by control device 24 to provide a magnetic field having a gradient G which may be controlled individually in the X, Y and Z directions to yield any desired net gradient. All this is well understood by the prior art.

In particular, the gradient G is provided by means shown schematically as additional magnets 22, which are controlled by controller 24 to vary the gradient to provide a number of different magnetic field gradients needed to complete an image of the sample B. In a typical system, 256 different gradients are provided to provide 256 different X and Y values, such that a total image of approximately 64,000 pixels (that is, 256×256 pixels) can be separately generated. (The field $H_0$ and the gradient G are of course vectors. The conventional notation for vector fields $\vec{H}_0$ and $\vec{G}$ is not used herein for reasons of convenience.)

According to the present invention, an additional coil shown schematically in FIG. 1 at 26 is added for providing an additional time-varying magnetic field. This additional magnetic field will typically be much less, for example, $10^{-3} - 10^{-4}$ less, than $H_0$. Coil 26 is under the control of an additional controller 28, the operation of which is described in detail below. Typically controllers 24 and 28 will be one and the same, both being comprised by a computer operating for NMR machine. They are shown separately here for clarity.

Those skilled in the art will recognize that it would be possible to vary the field provided by the main magnet 20 rather than add the additional coil 26 to obtain the same desired field variation. However, in order to provide accurate control of the additional field, it is generally simpler to add the additional coil 26 rather than arrange for control of a relatively small variation in the field provided by the large magnet 20. Moreover the additional coil 26 may be made much smaller and may have comparatively faster response time than does the relatively large valued magnet 20.

As described briefly above, the present invention includes a flow imaging technique in which the frame of reference is effectively moved at a specified velocity, such that nuclei moving at that velocity are essentially at rest with respect to the frame of reference. In this way the NMR signal detected with respect to these nuclei is a maximum compared to that from nuclei moving at other velocities ("Velocity" as used herein refers to both a direction and a rate of movement).

The invention was first implemented using steady-state free precession (SSFP) techniques, generally as described in the co-pending application referred to above. The invention will be described in the SSFP connection first so as to simplify the description of the invention. It will be appreciated by those skilled in the art, however, that conventional "spin echo" techniques are also suitable for practice of the present invention. This will also be described briefly below.

As described above, an external field $H_0$ is applied to a sample of interest. Nuclei in the sample then are aligned with respect to the direction of the lines of the field $H_0$, and precess therearound at the Larmor frequency. When a subsequent pulse of radio frequency energy at the Larmor frequency is applied, the nuclei are caused to take a new alignment with respect to this external field, and then continue to precess at the Larmor frequency. As is well known, this precession frequency is a function of the applied magnetic field and of the gyromagnetic ratio of the nucleus, which in turn is a function of the species of the nucleus.

After the radio frequency pulse ceases, the nuclei return to alignment with the field $H_0$ over a period of time. The "relaxation time" $T_1$, within which a predetermined portion of the nuclei return to alignment with $H_0$, is a characteristic of the material and is used in conventional imaging techniques to identify the material. The relaxation of the nuclear magnetic moments perpendicular to $H_0$ is characterized by a different relaxation time $T_2$. The times $T_1$, $T_2$ and the proton density are used in conventional imaging techniques to identify the materials of the sample.

Figure 2:
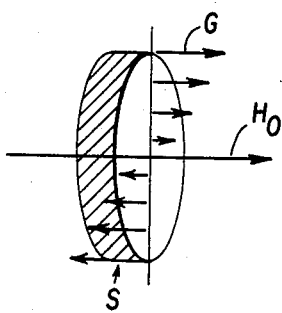
FIG. 2 shows an example of the relative orientation of the external magnetic field $H_0$ and of the gradient G through a slice of tissue S to be imaged.

FIG. 2 shows the gradient G of the magnetic field through a "slice" S of a sample to be measured, for example, a section through the torso of a patient. The slice S is not necessarily perpendicular to the external field $H_0$. As shown, the variation in the magnetic field, of which the gradient G is the measure, provides variation of the Larmor frequency of nuclei in the sample across the extent of the slice S, which is necessary to provide images, as understood generally in the art.

Throughout the following discussion, the contribution made by the magnetic field $H_0$ to the precession of the nuclear spins will be ignored, as is conventional in the art. Similarly, the discussion will be from the point of view of the rotating reference frame, that is, that of the nuclei in $H_0$, again as is entirely conventional in the art. As also conventional in the art, terminology such as "a 90° pulse" will be used to refer to a radio frequency pulse supplied by energization of the coil 12 for a length of time sufficient to cause nuclei to precess through 90° so that their orientation is 90° to the magnetic field $H_0$.

Figure 3:
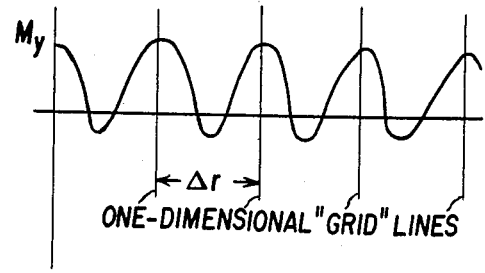
FIG. 3 shows one component of the vector magnetization of the nuclear spins along the direction of the gradient within the selected slice S, for the case of SSFP.

FIG. 3 shows what occurs when the radio frequency oscillator 14 and switch 16, under control of control device 24, are operated to provide a regular sequence of pulses of radio frequency energy in the slice S, disposed in a relatively strong field $H_o$ having a gradient G. (As a matter of interest to those of skill in the art, the gradients required by the present invention are those typically available in clinical NMR machinery; the high gradients presently found primarily in laboratory equipment, as used for example in diffusion studies, in general are not required for practice of the techniques of the invention.)

According to the steady-state free precession (SSFP) technique, application of a sequence of RF pulses will cause the nuclei at intervals $\Delta r$ to establish a magnetization which is periodic in space, as shown in FIG. 3, that is, to have a spatial periodicity $\Delta r$. This is referred to as the driven equilibrium state. Experimental results indicate that the driven equilibrium state is established after a time on the order of $T_1$.

FIG. 3 shows the establishment of spatial periodicity schematically. All three vector components of the magnetization have the same periodicity $\Delta r$, one of which is shown schematically in FIG. 3. The periodicity $\Delta r$ is equal to the quantity $1/G\gamma\tau$. In this relation, G is the gradient and $\gamma$ is the gyromagnetic ratio of the nucleus (42.576 MHz/Tesla for hydrogen nuclei). Because the gradient G and the time constant $\tau$ are independently controllable, $\Delta r$ can be chosen according to the invention.

As described more fully in the co-pending application referred to above, steady-state free precession techniques have been in use in the art for some time. One difficulty with the SSFP technique as usually practiced is that the maximum signal occurs just when the radio frequency excitation signal is transmitted. This tends to "swamp" the NMR signal received from the nuclei. According to the invention of the co-pending application Ser. No. 765,528 referred to above, this swamping is overcome by reversing the gradient during a period of the interpulse interval. This reversal forces the spins to rephase between the radio frequency pulses and allows the peak in the signal to be detected. Reference is made to the co-pending application for a more thorough discussion of this inventive technique.

According to the image formation technique also described in the co-pending application Ser. No. 765,528 referred to above, two images are generated using different interpulse intervals and hence having different spatial periodicities $\Delta r$. One image is subtracted from the other; this has the effect of cancelling out static nuclei such that the remainder is equal only to slowly flowing nuclei, for example in capillaries or the like. While this invention has substantial utility it is limited, for example, when used in connection with capillary flow studies, in that the subtraction must be performed precisely, because the remainder is only a few percent of the overall signal.

According to the present invention a single image is formed of flowing nuclei. A moving reference frame is created. The velocity of the moving frame of reference is chosen so that the nuclei being studied are in effect static with respect to the frame of reference. Therefore, their contribution to the NMR signal is proportionally larger than that of static or faster-flowing nuclei. A single image can thus be generated without subtraction.

As described above, the present invention can be implemented using steady-state free precession or more conventional spin echo techniques. SSFP techniques will be described first in this application because that is the way in which the technique of the invention was first tested. Subsequently, explanation is provided of spin echo techniques for practice of the invention.

FIG. 4 shows conventional SSFP techniques, in which the reference frame is stationary. As mentioned, the SSFP condition is produced by applying a stream of rf pulses separated by an interpulse interval $\tau$. See FIG. 4(a), which shows the sequence of RF pulses. In the presence of a read gradient $G_R$, both a longitudinal and transverse steady state magnetization response is established which is periodic along $G_R$. The read gradient according to the invention and the observed NMR signal, as functions of time, are shown in FIGS. 4(b) and (c) respectively. The read gradient waveform G has been modified as shown in FIG. 4(b), and according to the teachings of the copending application referred to above, from its traditional constant value as a function of time, so that the gradient is reversed each interpulse interval for $\approx 0.2\tau$. The magnetization rephases at points A in FIG. 4(b) in addition to the standard rephasing (not shown) at the center of each rf pulse. A full spin echo can then be collected without interference from the transmitter rf pulses. The spatial wavelength of the magnetization is given by $$\Delta r = \frac{1}{\gamma G_{eff} \tau} \quad (1)$$

where $$G_{eff} = \frac{1}{\tau} \int_0^\tau G_R(t) dt \quad (2)$$

The earlier work of the inventor and another, as described in their paper incorporated by reference above, shows that the NMR signal is a maximum for static spins and monotonically decreases as a function of positive or negative velocity along $G_R$. The reason for this is that moving spins are continually establishing a new steady state response, since the magnetization response is a function of position. Since a finite time is required for a nucleus to attain the driven equlibrium state in SSFP, the observed signal decreases as the nuclei move faster relative to the fixed frame of reference.

According to the present invention, a moving reference frame is established in which the periodic magnetization occurs. For the case of the pulse sequence shown in FIG. 4(b), the magnetization is periodic in one dimension. A stationary 1-dimensional grid whose grid lines are separated by $\Delta r$ (FIG. 3) is thus provided. Spins moving with respect to the grid reference frame establish a lesser response than spins stationary with respect to the grid, and the NMR signal is accordingly less. Thus, if one can effectively establish a moving grid, that is, a moving frame of reference, the signal will be largely due to nuclei in a velocity window centered at the speed of the grid.

In general, two conditions must be met to establish a moving reference frame in order to image flow according to the invention. (As will be discussed below, only the first condition need be satisfied in one type of spin echo image formation technique.)

1. The Larmor precession frequency of a particular moving spin must be substantially the same each time data is collected. This is necessary in order to keep the position of moving nuclei fixed in projections obtained during successive interpulse intervals $\tau$ in SSFP, or in successive spin-echoes in a multiple spin-echo technique.

To provide a reference frame moving linearly, that is, to satisfy this condition for a spin moving with constant linear velocity $v$ along a positively sloped gradient $G_R$, the main field H must be reduced while the data is collected by an amount $$\Delta H = -G_R v \tau \eta \quad (3)$$

where $\eta$ is an integer representing the number of elapsed intervals $\tau$. It will be appreciated that this equation (3) simply states that the magnitude of the change in the field $\Delta H$ must be equivalent to that of the change of the field experienced by nuclei moving the distance $v\tau\eta$ in the gradient $G_R$. It will also be appreciated, however, that generally the H field and the gradient will not be aligned. This condition must be satisfied in connection with both SSFP and multiple spin echo image formation techniques employing the "moving reference frame" technique of the present invention.

2. Where steady-state free precession image formation techniques are used, or where spin echo image techniques involving Fourier transformations which require phase information are employed, a second condition must be met. This condition is that the phase through which a moving spin precesses is the same as it would be for a static spin. In SSFP, the phase through which a spin precesses between any two rf pulses must be constant. This is necessary to keep the steady state magnetization response of the moving spin constant. In the case of multiple spin echo experiments, the phase a moving spin precesses between spin echoes must be constant.

To deal with the second condition for SSFP, note that the phase $\phi$ through which a linearly moving spin precesses during an interval $\tau$ due to the read gradient is given by $$\phi = \gamma \int_{\eta\tau}^{(\eta + 1)\tau} G_R(t)[x_0 + vt]dt \quad (4a)$$

That is, the phase shift is a simple function of the distance $v\tau$, measured from a starting point $x_0$, through which the nuclei move with respect to the gradient. The expression on the right side of Eq. 4a can be broken into two parts as follows:

$$\phi = \gamma x_0 \int_{\eta\tau}^{(\eta + 1)\tau} G_R(t)dt + \gamma v \int_{\eta\tau}^{(\eta + 1)\tau} G_R(t)t \, dt \quad (4b)$$

The phase shift $\phi$ is composed of two terms. The first term on the right side of the equation is constant as a function of the starting time, $\eta\tau$, but the second term on the right is not constant. Therefore, the additional phase shift expressed by the second term, which is due to the linear motion of the nuclei must be compensated. This can be done by simply imposing a condition on the deviation of the main field $\Delta H$; that is, by setting $\Delta H$ so that it provides a phase shift equal and opposite to the phase shift due to the second term:

$$\gamma \int_{\eta\tau}^{(\eta + 1)\tau} \Delta H(t)dt = -\gamma v \int_{\eta\tau}^{(\eta + 1)\tau} G_R(t)t \, dt \quad (5)$$

In an experiment which successfully tested the invention, a Helmholtz coil as shown schematically at 26 in FIG. 1 was constructed to control the main field deviation $\Delta H$. The waveform of the field of the Helmholtz coil is shown in FIG. 5(c): FIG. 5(a) shows the RF pulse sequence, FIG. 5(b) the gradient, and FIG. 5(d) the detected signal.

As will be appreciated, the pulse sequence shown is an SSFP sequence. Reference is made to the copending application discussed above for full details of the SSFP sequence.

Theoretically, the field $\Delta H$ should be continuously varying at the same rate at which the spins of interest move in the gradient G. For very slowly moving spins, as in the experiment described herein, an approximation has been made, that since the slope of the waveform $\Delta H$ for slow spins is very shallow during the data collection time $\tau_n$ (FIG. 5(c)), the ideally sloped waveform may be replaced with a constant value.

The magnitudes of the positive and negative portions of the Helmholtz coil waveform in a particular interpulse interval shown in FIG. 5(c) are arbitrarily chosen to be identical. The dwell time for the negative portion of the waveform is denoted $\tau_n$ and the positive portion (which is composed of two parts) $\tau_p$. Condition 1 is satisfied, using Eq. (3) to determine the amplitude. Note that the data of FIG. 5(d) is collected during the negative portion $\tau_n$ of the coil's activation.

Condition 2 will now be used to determine $\tau_p$. We evaluate the integrals of Eq. (5) for n=0 with the assumption that $x=x_0$ for $t=0$:

$$(\Delta H)(\tau_p - \tau_n) = \frac{vG_R}{2}(\tau_1^2 - \tau_2^2) \quad (6)$$

where $\tau_1$ and $\tau_2$ are the positive and negative dwell times respectively for the read gradient (see FIG. 5(b)). Substituting $\Delta H = -G_R v \tau$ and rearranging, we have $$\tau_p - \tau_n = \frac{(t_1^2 - \tau_2^2)}{2\tau} \quad (7)$$

Eq. (7) is used to solve for $\tau_p$ as a function of $\tau_1$, $\tau_2$, $\tau_n$ and $\tau$. An important feature of the relation of Eq. (7) is that it is velocity independent. Therefore to move the grid at different speeds, one merely needs to change the amplitude of the step $\Delta H$ given by Eq. (3).

Figure 6:
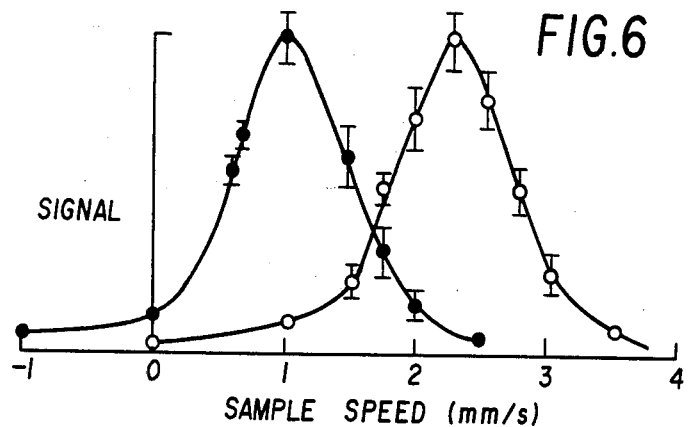
FIG. 6 shows experimental results, and is a graph showing the amount of signal received as a function of sample motion, with respect to two different moving reference frame velocities.

In the experiment which tested this invention, an apparatus was constructed to linearly transport a carriage which carried a 30 cc sample of water in a conventional NMR machine. The Helmholtz coil described previously was controlled using an unneeded gradient control circuit. FIG. 6, which graphs the NMR signal amplitude versus carriage velocity, shows the results. Two moving grid speeds were programmed in, and projections of the NMR signal of the sample were recorded as functions of the sample speed. The two grid speeds used were 1.1 and 2.2 mm/sec. The solid dots correspond to movement of the grid at 1.1 mm/sec. and the open dots at 2.2 mm/sec. The signal is clearly at a maximum when the sample speed corresponds to the grid speed. Note that the solid lines in FIG. 6 are drawn in by hand to show the velocity window and are not theoretical fits to the data.

It will be appreciated that there has been described a one-dimensional imaging technique in accordance with the present invention which provides a linearly moving reference frame using an SSFP data collection technique. In a single SSFP data collection, one obtains signal from nuclei moving in a velocity window. The center of the velocity window is determined by the speed of the moving grid. The width of the window can easily be manipulated by changing $\Delta r$, as described in the copending application and the journal article, coauthored by the present inventor, both incorporated by reference above.

It will be appreciated that according to the technique of the invention, one cannot track a moving spin if it moves outside the excitation volume of the rf coil. Therefore to do signal averaging under such circumstances it may be necessary to stop the SSFP sequence and start it up again, in effect averaging over different nuclei with the same trajectories.

There has been described above a technique for forming what is in effect a one dimensional image. The moving reference frame technique of the invention in effect means that the signal is received from nuclei which are static with respect to the moving frame. These are various prior art imaging techniques used in connection with static nuclei which can be used to provide two-dimensional images of flowing nuclei according to the present invention.

For example, it is envisioned that conventional "phase encoding gradient" techniques can be employed to form a two dimensional image in accordance with the present invention. According to these techniques, stated broadly, a gradient orthogonal to the read gradient and within the slice S is used to encode spatial information in a second dimension in successive spin echoes. A Fourier SSFP technique is described in a publication by the present inventor and R. C. Hawkes, in Volume 4, pages 9–23 of *Mag. Res. in Medicine* in January, 1987. These image-forming techniques are generally within the skill of the art and need not be discussed in detail here.

Those of skill in the art will have no difficulty in implementing the invention given the above disclosure; apparatus generally suited for performing the method of the invention is commercially available from a number of manufacturers.

As mentioned, several distinct image formation techniques suitable for use in connection with practice of the present invention are within the skill of the prior art. One example includes the so-called two and three-dimensional Fourier image formation techniques, which use multiple spin echoes. In such case, phase information is critical and both of the conditions discussed above must be employed. On the other hand, it would also be possible to use the so-called "back-projection" image formation technique in connection with the moving frame of reference technique of the present invention. Back-projection NMR image formation, as is well understood, only relies upon the magnitude of the Fourier transform and hence the phase information is not relevant. Therefore the second condition discussed above need not be satisfied.

It is not thought, however, that back-projection will be a viable two-dimensional image formation technique, since as is well known in the prior art, back projection involves changing the direction of the read gradient and hence the direction of flow sensitivity during the imaging process. Thus only when spins whose velocity is isotropic in the imaging plane are imaged is back projection likely to be employed in connection with the present invention.

Figure 7:
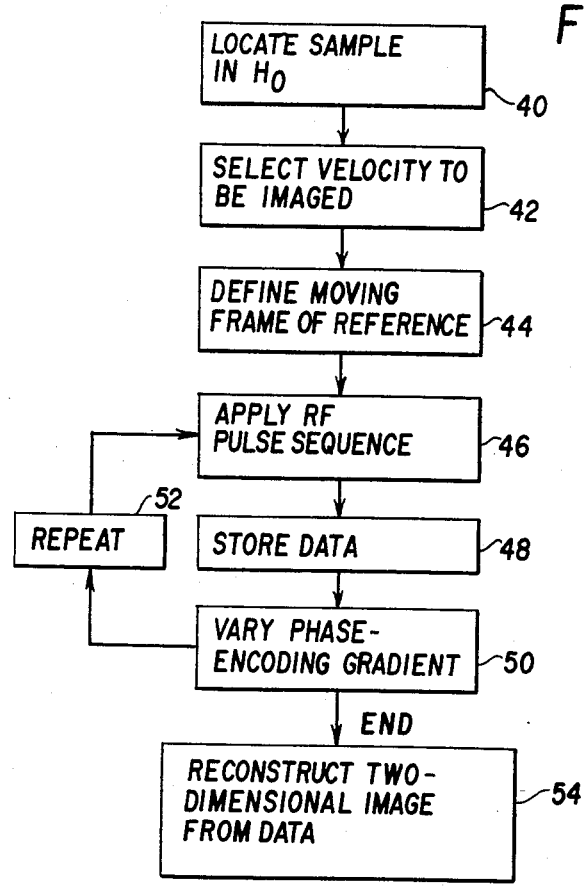
FIG. 7 shows schematically the steps taken in NMR image generation according to the invention.

FIG. 7 shows in very schematic form the steps in generating an NMR image of nuclear velocity according to the invention. At 40 a sample is located within the magnetic field $H_0$. At 42 the velocity of nuclei to be imaged is selected. At 44 the moving reference frame needed to select the nuclei to be imaged is defined; that is, the magnetic field $\Delta H$ which will satisfy the two conditions discussed above is determined. Processing begins at 46 when the radio frequency pulse sequence selected to define the spacing $\Delta r$ is applied. The NMR signal is collected and stored in a computer, as indicated at 48. Between successive spin echoes, the phase encoding gradient is varied, as shown at 50, and the entire process is repeated a number of times as indicated at 52. The computer then reconstructs the image using the stored data, as indicated at 54.

As indicated above each of the individual steps in this process is generally within the skill of the art, given applicant's contribution of the idea of using the moving reference frame to allow moving nuclei in effect to be stationary. It is believed therefore that the practice of the invention is fully enabled by the above disclosure together with the other literature references which are incorporated by reference above.

As will be appreciated by those of skill in the art, change in the RF oscillator frequency is equivalent to change in the magnetic field $H_0$. Hence it is at least theoretically possible to provide the moving reference frame by variation in the frequency and phase of the RF oscillator.

Finally, it should be appreciated that movement of the reference frame in a nonlinear fashion with respect to time is also possible in accordance with the present invention. For example, one can move the reference frame in a pulsatile manner gated to the heart beat in order to image blood flow in the blood vessels immediately surrounding the heart, which might be of very significant clinical interest.

It will be appreciated by those skilled in the art that the techniques of the invention are applicable to formation of images of a wide variety of flowing nuclei. As described above, imaging of flowing nuclei of blood is an application of primary interest. This is useful in the image of blood flow in organs and the like. In this manner the overall health of the organ can be evaluated.

Use of the technique of the invention to imaging of blood flow is generally as described above. The slice S is selected to coincide with the organ of interest, and the moving frame of reference is defined to move in the direction and at the velocity of the blood flow of interest. Of course, multiple images at varying orientations and imaging differing velocities may be made to provide a more complete "picture" of blood flow in a particular organ.

Those skilled in the art will also recognize that the fact that the technique of the invention, avoiding as it does subtraction of multiple images to cancel static nuclei, provides a distinct advantage over prior art techniques which involve such mathematical operations. The avoidance of multiple images of course saves time and trouble. As is especially significant in the case of small signal nuclei, for example, slow-moving nuclei as in capillary flow, the present invention, by avoiding subtraction or other multiple-image techniques, in effect provides an improved signal-to-noise ratio. An overall improvement in image clarity of blood flow, particularly of capillary flow, is therefore to be anticipated from the practice of the invention.

Other uses and applications of the techniques of the invention will be apparent to those of skill in the art and are deemed to be within the scope of the invention. Therefore the invention should not be limited by the above exemplary disclosure but only by the following claims.

What is claimed is:

1. A method for measuring movement of nuclei in a sample using a nuclear magnetic resonance technique, comprising the steps of:
    exciting a nuclear magnetic resonance signal;
    measuring said nuclear magnetic resonance signal emitted by said nuclei; and
    determining the nuclei moving in a given range of velocities;
    wherein a moving reference frame adjustment parameter is effectively varied over time to provide a moving reference frame to which the motion of said nuclei is effectively compared in said measuring and determining steps so as to cause nuclei moving with the reference frame to have an NMR response substantially the same as the nuclei would have if both the reference frame and the nuclei were stationary; and
    wherein resolution of velocity is independent of the thickness, in the direction of motion of the reference frame, of a volume in which nuclei are excited and from which the NMR response is sampled.

2. A method of measuring the velocity of flow of a fluid, comprising the steps of:
    selecting a particular fluid velocity range to be studied;
    applying a radio frequency excitation signal to said fluid;
    applying a time varying magnetic field to a sample, said time varying magnetic field varying at a rate such that a reference frame moving at a velocity equal to the velocity of the fluid to be studied is created so as to cause nuclei moving with the reference frame to have an NMR response substantially the same as the nuclei would have if both the reference frame and the nuclei were stationary, wherein resolution of velocity is independent of the thickness, in the direction of motion of the reference frame, of a volume in which nuclei are excited and from which the NMR response is sampled;
    detecting a nuclear magnetic resonance (NMR) signal from said sample; and
    using said NMR signal to generate an image of fluid flowing in said velocity range, whereby static nuclei are prevented from making as great a contribution to the NMR signal as the nuclei flowing in the velocity range to be studied.

3. A method for selectively imaging flowing nuclei using nuclear magnetic resonance (NMR) techniques, comprising the steps of:
    selecting a velocity for study;
    defining a frame of reference moving with a velocity substantially equal to the velocity to be studied so as to cause nuclei moving with the reference frame to have an NMR response substantially the same as the nuclei would have if both the reference frame and the nuclei were stationary; and
    applying successive pulses of radio frequency excitation energy and recording an NMR signal emitted by excited nuclei in intervals between applications of said radio frequency energy;
    wherein resolution of velocity is independent of the thickness, in the direction of motion of the reference frame, of a volume in which nuclei are excited and from which the NMR response is sampled.

4. A method for measuring movement of flowing nuclei using nuclear magnetic resonance (NMR) techniques, comprising the steps of:
    selecting a velocity range for study;
    defining a reference frame moving with a velocity within the velocity range for study;
    exciting nuclei so as to cause nuclei moving with the reference frame to have an NMR response substantially the same as the nuclei would have if both the reference frame and the nuclei were stationary; and
    detecting the NMR response;
    wherein resolution of velocity is independent of the thickness, in the direction of motion of the reference frame, of a volume in which nuclei are excited and from which the NMR response is sampled.

5. The method of claim 4, further comprising the steps, in coordination with said exciting and detecting steps, of:
    controlling the phase of nuclei moving with the reference frame so that the phase precesses the same amount between each said detecting step; and
    controlling the precession frequency of nuclei moving with the moving reference frame so that said precession frequency is substantially the same for each said detecting step.

6. The method of claim 5, wherein said defining step comprises:
    varying a main applied magnetic field.

7. The method of claim 6, further comprising the step of:
    using an SSFP imaging technique to form an image of the flowing nuclei based on NMR responses detected in said detecting step.

8. The method of claim 6, further comprising the step of:
    using a spin echo imaging technique to form an image of the flowing nuclei based on NMR responses detected in said detecting step.

9. The method of claim 5, wherein said defining step comprises:
    controlling a phase and frequency of excitation energy used to excite said nuclei; and
    controlling a phase and frequency of a reference signal in a receiver for receiving said NMR response.

10. The method of claim 9, further comprising the step of:
    using an SSFP imaging technique to form an image of the flowing nuclei based on NMR responses detected in said detecting step.

11. The method of claim 9, further comprising the step of:

using a spin echo imaging technique to form an image of the flowing nuclei based on NMR responses detected in said detecting step.

12. The method of claim 4, further comprising the step, in coordination with said exciting and detecting steps, of:
controlling the precession frequency of nuclei moving with the moving reference frame so that said precession frequency is substantially the same for each said detecting step.

13. The method of claim 12, wherein said defining step comprises:
varying a main applied magnetic field.

14. The method of claim 13, further comprising the step of:
using an SSFP imaging technique to form an image of the flowing nuclei based on NMR responses detected in said detecting step.

15. The method of claim 13, further comprising the step of:
using a spin echo imaging technique to form an image of the flowing nuclei based on NMR responses detected in said detecting step.

16. The method of claim 12, wherein said defining step comprises:
controlling a phase and frequency of excitation energy used to excite said nuclei; and
controlling a phase and frequency of a reference signal in a receiver for receiving said NMR response.

17. The method of claim 16, further comprising the step of:
using an SSFP imaging technique to form an image of the flowing nuclei based on NMR responses detected in said detecting step.

18. The method of claim 16, further comprising the step of:
using a spin echo imaging technique to form an image of the flowing nuclei based on NMR responses detected in said detecting step.

19. The method of claim 4, further comprising the step of:
using an SSFP imaging technique to form an image of the flowing nuclei based on NMR responses detected in said detecting step.

20. The method of claim 4, further comprising the step of:
using a spin echo imaging technique to form an image of the flowing nuclei based on NMR responses detected in said detecting step.

21. The method of claim 4, wherein said defining step comprises:
varying the velocity at which the moving reference frame moves.

22. The method of claim 21, wherein said defining step comprises:
varying the velocity at which the moving reference frame moves so as to measure pulsatile movement of said nuclei.

23. The method of claim 4, further comprising the steps of:
selecting one or more different velocity ranges for study;
performing said defining, exciting, and detecting steps one or more additional times; and
compiling a velocity distribution based on quantities of nuclei flowing in said one or more different velocity ranges.

24. The method of claim 4, wherein said defining step comprises:
selecting a velocity window which determines the contribution to the detected NMR response made by nuclei flowing near to, but not exactly at, the velocity of the moving reference frame.

25. The method of claim 24, wherein said step of selecting a velocity window comprises:
changing a magnetization response's spatial periodicity established in said NMR technique.

26. An apparatus for measuring movement of flowing nuclei using nuclear magnetic resonance (NMR) techniques, comprising:
means for selecting a velocity range for study;
means for defining a reference frame moving with a velocity within the velocity range for a study;
means for exciting nuclei so as to cause nuclei moving with the reference frame to have an NMR response substantially the same as the nuclei would have if both the reference frame and the nuclei were stationary; and
means for detecting the NMR response;
wherein resolution of velocity is independent of the thickness, in the direction of motion of the reference frame, of a volume in which nuclei are excited and from which the NMR response is sampled.

27. The apparatus of claim 26, further comprising:
means, acting in coordination with said exciting means and said detecting means, for controlling the phase of nuclei moving with the reference frame so that the phase precesses the same amount between each detection of the NMR response; and
means, acting in coordination with said exciting means and said detecting means, for controlling the precession frequency of nuclei moving with the moving reference frame so that said precession frequency is substantially the same for each detection of the NMR response.

28. The apparatus of claim 27, wherein said defining means comprises:
means for varying a main applied magnetic field.

29. The apparatus of claim 27, wherein said defining means comprises:
means for controlling a phase and frequency of excitation energy used to excite said nuclei; and
means for controlling a phase and frequency of a reference signal in a receiver for receiving said NMR response.

30. The apparatus of claim 26, further comprising:
means, functioning in coordination with said exciting means and said detecting means, for controlling the precession frequency of nuclei moving with the moving referencesd frame so that said precession frequency is substantially the same for each detection of the NMR response.

31. The apparatus of claim 30, wherein said defining means comprises:
means for varying a main applied magnetic field.

32. The apparatus of claim 30, wherein said defining means comprises:
means for controlling a phase and frequency of excitation energy used to excite said nuclei; and
means for controlling a phase and frequency of a reference signal in a receiver for receiving said NMR response.

33. The apparatus of claim 26, wherein said defining means comprises:
means for varying the velocity at which the moving reference frame moves.

* * * * *